(12) United States Patent
Chi

(10) Patent No.: US 7,570,536 B2
(45) Date of Patent: Aug. 4, 2009

(54) COLUMN REDUNDANCY CIRCUIT

(75) Inventor: Sung Soo Chi, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 18 days.

(21) Appl. No.: 12/005,480

(22) Filed: Dec. 27, 2007

(65) Prior Publication Data

US 2008/0259709 A1    Oct. 23, 2008

(30) Foreign Application Priority Data

Apr. 23, 2007    (KR)    ........................ 10-2007-0039251

(51) Int. Cl.
*G11C 7/00*    (2006.01)
(52) U.S. Cl. .................... 365/222; 365/200; 365/194
(58) Field of Classification Search ................ 365/222, 365/200, 194
See application file for complete search history.

(56) References Cited

U.S. PATENT DOCUMENTS

| | | | | |
|---|---|---|---|---|
| 5,870,341 A | * | 2/1999 | Lin et al. ................ | 365/200 |
| 6,327,210 B1 | * | 12/2001 | Kuroda et al. .......... | 365/222 |
| 7,486,577 B2 | * | 2/2009 | Kim et al. ............... | 365/200 |
| 2007/0033450 A1 | | 2/2007 | Dray | |

* cited by examiner

*Primary Examiner*—Connie C Yoha
(74) *Attorney, Agent, or Firm*—John P. White; Cooper & Dunham LLP

(57) ABSTRACT

A column redundancy circuit is disclosed. The column redundancy circuit includes a first control signal generator configured to receive a refresh flag signal having an enable width larger than that of a refresh signal and a control signal and generate a pull-up control signal, a second control signal generator configured to receive the refresh flag signal and an address signal and generate a pull-down control signal, and a column repair fuse circuit configured to receive the pull-up control signal and the pull-down control signal and generate a redundant cell access signal.

13 Claims, 5 Drawing Sheets

COLUMN REDUNDANCY CIRCUIT

BACKGROUND

The present disclosure relates to a column redundancy circuit, and more particularly to a column redundancy circuit for preventing a control signal associated with a row path from being toggled, using a refresh signal with an enable width adjusted, so as to reduce current consumption in a refresh mode.

In general, a dynamic random access memory (DRAM) comprises a unit cell which is composed of one switching transistor and one storage capacitor. As a result, different from a static random access memory (SRAM) or flash memory, the DRAM may be subject to a phenomenon in which data stored in the cell is lost due to leakage current with the lapse of time. In order to prevent this phenomenon, the data stored in the cell is externally written into the cell again at regular time intervals. This operation is called a refresh. The refresh is performed in such a manner that each word line is selected at least once within a retention time of each cell of a memory cell array, and data of each cell connected to the selected word line is sensed and amplified and then rewritten into the cell. Here, the retention time refers to a time for which data can be retained in a cell with no refresh after being written in the cell.

The refresh is generally performed with respect to a row address which is generated by an internal counter in response to a refresh command. Thus, the refresh can be carried out by merely changing only the row address, so that there is required no operation of a column path in a refresh mode.

On the other hand, when a defect occurs in some memory cells in a memory device, the chip typically does not operate in the expected manner. In this case, a repair operation is performed which replaces a memory cell determined through testing_to be defective with a redundant memory cell formed in advance. In this repair operation, a column repair operation which is performed through a column redundancy circuit may employ, when a fail occurs in a specific cell, a scheme for repairing the specific cell, including even all other cells not failed, as shown in FIG. 7, or a scheme for column-repairing only cells of a failed block as shown in FIG. 8.

BRIEF SUMMARY

In an aspect of the present disclosure, a column redundancy circuit comprises a first control signal generator configured to receive a refresh flag signal having an enable width larger than that of a refresh signal and a control signal and generate a pull-up control signal, a second control signal generator configured to receive_the refresh flag signal and an address signal and generate a pull-down control signal, and a column repair fuse circuit configured to receive the pull-up control signal and the pull-down control signal and generate a redundant cell access signal.

The column redundancy circuit may further comprise a delay for delaying the refresh signal by a predetermined period, and a logic device configured to receive the refresh signal and an output signal from the delay and generate the refresh flag signal.

The pull-up control signal may be not enabled in response to the refresh signal.

Preferably, the first control signal generator comprises a logic device for performing a logic operation with respect to the control signal and the refresh flag signal.

The first control signal generator may further comprise a buffer for buffering an output signal from the logic device.

The pull-down control signal may be not enabled in response to the refresh signal.

Preferably, the second control signal generator comprises a logic device for performing a logic operation with respect to the address signal and the refresh flag signal.

The second control signal generator may further comprise a buffer for buffering an output signal from the logic device.

Preferably, the column repair fuse circuit comprises a pull-up device connected between a supply voltage terminal and an output node for pulling the output node up in response to the pull-up control signal, a plurality of fuses connected in parallel to the output node, a plurality of pull-down devices connected between a ground voltage terminal and the fuses, respectively, for pulling the output node down in response to the pull-down control signal, and a latch for latching a signal at the output node.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF EXEMPLARY EMBODIMENTS

Figure 1:
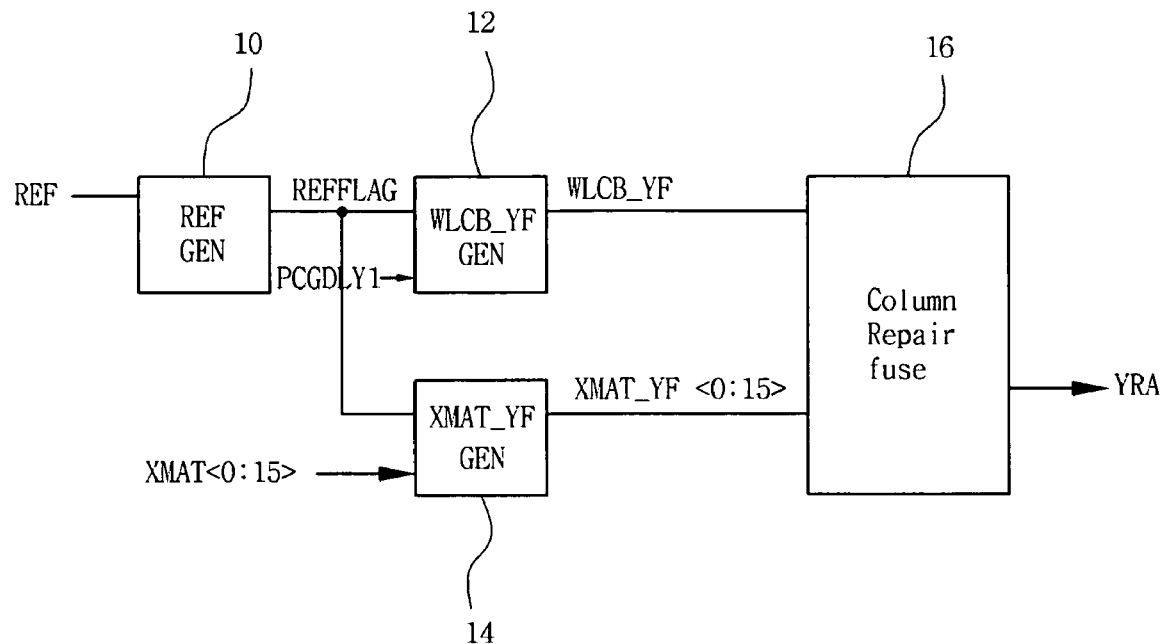
FIG. 1 is a block diagram showing the configuration of a column redundancy circuit according to an embodiment of the present invention.

FIG. 1 is a block diagram showing the configuration of a column redundancy circuit according to an embodiment of the present invention.

As shown in FIG. 1, the column redundancy circuit according to this embodiment comprises a refresh signal generator 10 configured to receive a refresh signal REF and generate a refresh flag signal REFFLAG having an enable width larger than that of the refresh signal REF, a pull-up control signal generator 12 configured to receive the refresh flag signal REFFLAG and a control signal PCGDLY1 and generate a pull-up control signal WLCB_YF, a pull-down control signal generator 14 configured to receive the refresh flag signal REFFLAG and an address signal XMAT<0:15> and generate a pull-down control signal XMAT_YF<0:15>, and a column repair fuse circuit 16 configured to receive the pull-up control signal WLCB_YF and the pull-down control signal XMAT_YF<0:15> and generate a redundant cell access signal YRA.

Figure 2:
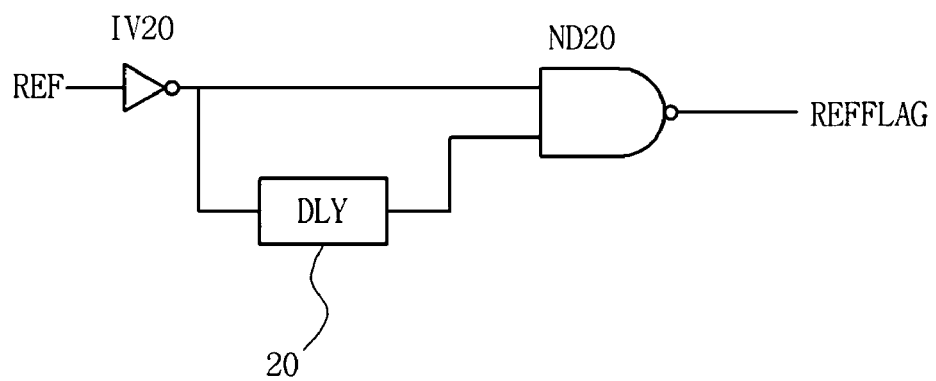
FIG. 2 is a circuit diagram of a refresh signal generator in FIG. 1.

The refresh signal generator 10 includes, as shown in FIG. 2, an inverter IV20 for inverting the refresh signal REF, a delay 20 for delaying an output signal from the inverter IV20 by a predetermined period, and a NAND gate ND20 for performing a NAND operation with respect to the output signal from the inverter IV20 and an output signal from the delay 20 to generate the refresh flag signal REFFLAG. Here, the refresh signal REF is enabled at the time that a refresh command is input.

Figure 6:
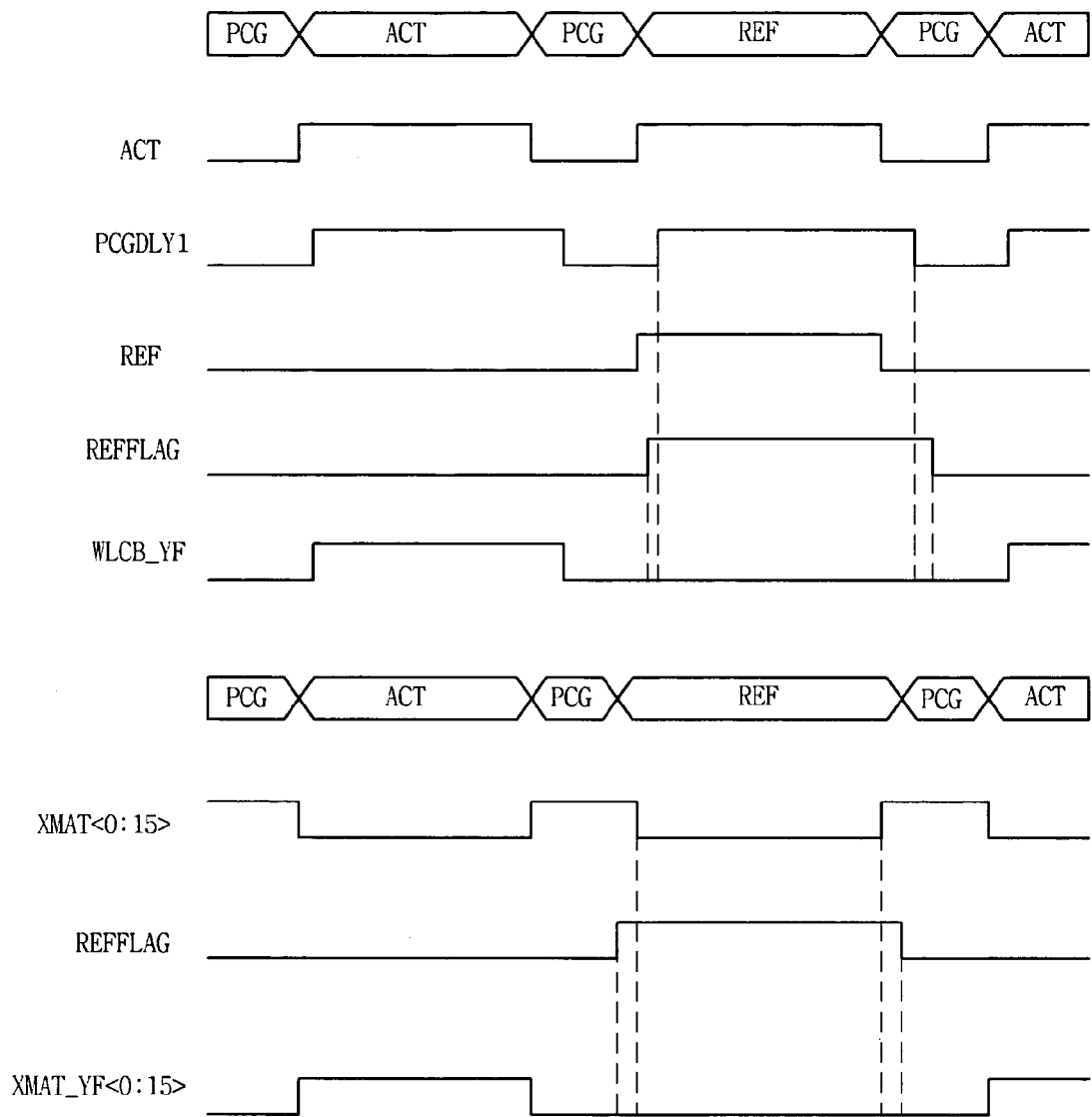
FIG. 6 is a timing diagram of internal signals of the column redundancy circuit of FIG. 1.
Figure 7:
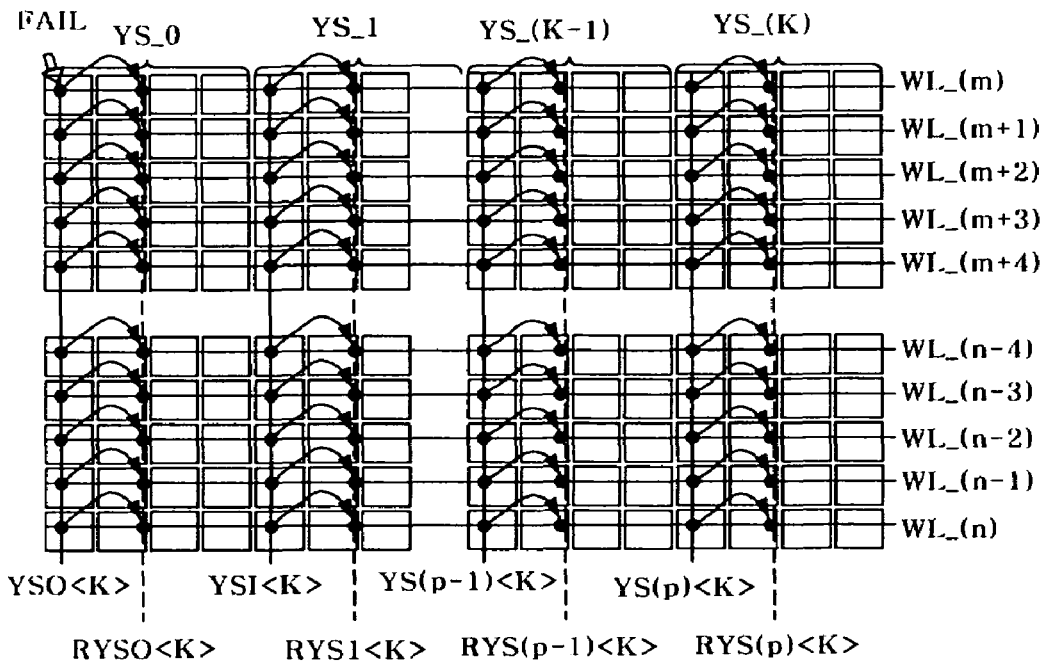
FIG. 7 is a view illustrating an example of a conventional column repair scheme.
Figure 8:
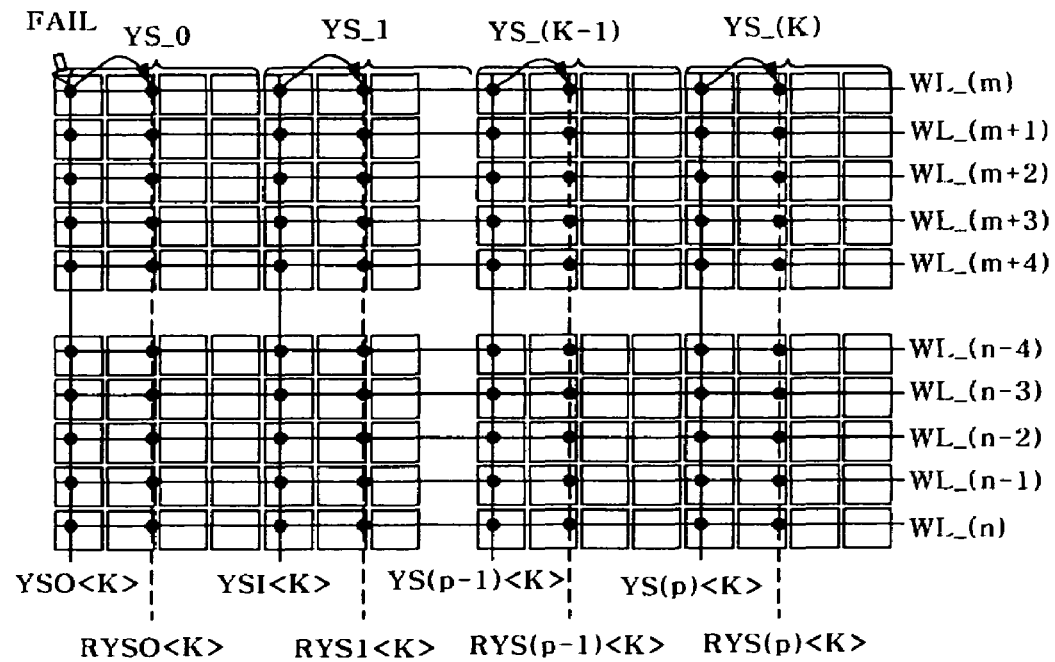
FIG. 8 is a view illustrating another example of a conventional column repair scheme.

The refresh signal generator 10 acts to receive the refresh signal REF and generate the refresh flag signal REFFLAG, which is a refresh signal having an enable width larger than that of the refresh signal REF. In more detail, an inverted signal of the refresh signal REF is input to one input terminal of the NAND gate ND20, and the output signal from the delay 20, namely, a delayed signal of the refresh signal REF (inverted) is input to the other input terminal of the NAND gate ND20. As a result, the enable width (high-level duration) of the refresh flag signal REFFLAG from the NAND gate ND20 becomes larger than that of the refresh signal REF. In the present embodiment, the waveforms of the refresh signal REF and the refresh flag signal REFFLAG generated by the refresh signal generator 10 are shown in FIG. 6.

Figure 3:
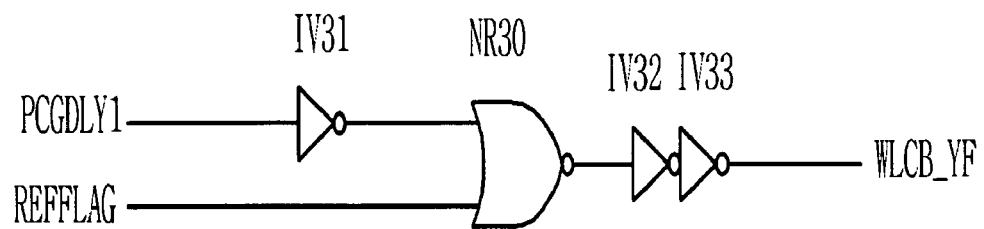
FIG. 3 is a circuit diagram of a pull-up control signal generator in FIG. 1.

The pull-up control signal generator 12 includes, as shown in FIG. 3, an inverter IV31 for buffering the control signal PCGDLY1, a NOR gate NR30 for performing a NOR operation with respect to an output signal from the inverter IV31 and the refresh flag signal REFFLAG, and an inverter chain for buffering an output signal from the NOR gate NR30 to generate the pull-up control signal WLCB_YF. Here, the inverter chain is composed of a pair of inverters IV32 and IV33. The control signal PCGDLY1 is enabled at a predetermined delay period after a memory cell is made active by a read command, write command, refresh command, etc. The pull-up control signal generator 12 acts to generate the pull-up control signal WLCB_YF of the same level as that of the control signal PCGDLY1 when the refresh flag signal REFFLAG assumes a low level, and generate the pull-up control signal WLCB_YF of a low level irrespective of the control signal PCGDLY1 when the refresh flag signal REFFLAG makes a low to high level transition in a refresh mode. Preferably, the enable width of the refresh flag signal REFFLAG is adjusted by the refresh signal generator 10 such that the refresh flag signal REFFLAG is kept high in level at least for a period in which the control signal PCGDLY1 remains high in level by the refresh command. As a result, the pull-up control signal WLCB_YF assumes a low level in the refresh mode irrespective of the level of the control signal PCGDLY1.

Figure 4:
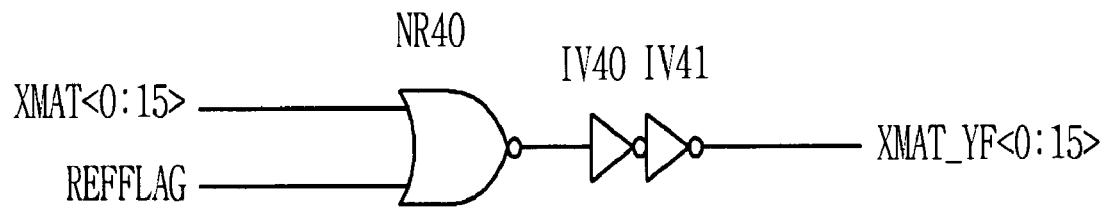
FIG. 4 is a circuit diagram of a pull-down control signal generator in FIG. 1.

The pull-down control signal generator 14 includes, as shown in FIG. 4, a NOR gate NR40 for performing a NOR operation with respect to the address signal XMAT<0:15> and the refresh flag signal REFFLAG, and an inverter chain for buffering an output signal from the NOR gate NR40 to generate the pull-down control signal XMAT_YF<0:15>. Here, the inverter chain is composed of a pair of inverters IV40 and IV41. In the present embodiment, the column redundancy circuit comprises pull-down control signal generators 14 of the same number as that of address signals XMAT<0:15> applied thereto. The pull-down control signal generator 14 acts to generate the pull-down control signal XMAT_YF<0:15>, which assumes a low level when at least one of the address signal XMAT<0:15> and the refresh flag signal REFFLAG is enabled to a high level. Here, because the refresh flag signal REFFLAG is kept high in level in the refresh mode, the pull-down control signal XMAT_YF<0:15> is kept low in level in a refresh period.

Figure 5:
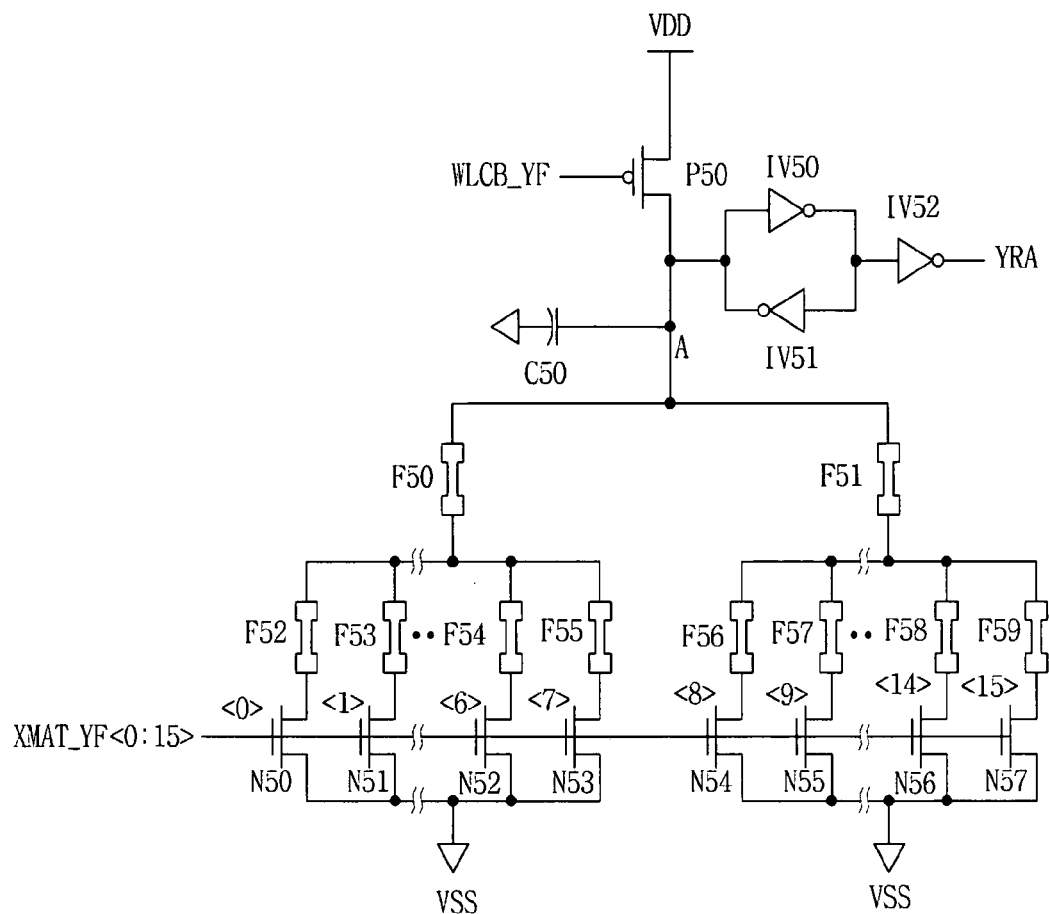
FIG. 5 is a circuit diagram of a column repair fuse circuit in FIG. 1.

The column repair fuse circuit 16 includes, as shown in FIG. 5, a p-channel metal oxide semiconductor (PMOS). transistor P50 connected between a supply voltage terminal VDD and a node A for pulling the node A up in response to the pull-up control signal WLCB_YF, a plurality of fuses F50 to F59 connected in parallel to the node A, a plurality of n-channel metal oxide semiconductor (NMOS) transistors N50 to N57 connected respectively between a ground voltage terminal VSS and the fuses F52 to F59 for pulling the node A down in response to the pull-down control signal XMAT_YF<0:15>, and a latch for latching a signal at the node A to generate the redundant cell access signal YRA, which is enabled to access a redundant cell assigned to a corresponding address. Here, the latch is composed of a pair of inverters IV50 and IV51. A capacitor C50 is connected between the node A and the ground voltage terminal VSS to model parasitic capacitance of the circuit. When the NMOS transistors N50 to N57 are turned on, charges stored in the capacitor C50 are discharged to the ground voltage terminal VSS. That is, a current path is formed.

The operation of the column redundancy circuit with the above-stated configuration according to the present embodiment will hereinafter be described in detail with reference to a timing diagram of FIG. 6.

First, the refresh signal generator 10 receives the refresh signal REF which is enabled high in level in the refresh mode, and generates the refresh flag signal REFFLAG. The refresh flag signal REFFLAG has an enable width adjusted such that the refresh flag signal REFFLAG is kept high in level at least for a period in which the control signal PCGDLY1 remains high in level by the refresh command. After receiving the refresh flag signal REFFLAG which is kept high in level in the refresh period, the pull-up control signal generator 12 generates the pull-up control signal WLCB_YF, which assumes a low level in the refresh mode irrespective of the level of the control signal PCGDLY1. Further, the pull-down control signal generator 14 generates the pull-down control signal XMAT_YF<0:15>, which assumes a low level in the refresh mode irrespective of the address signal XMAT<0:15>.

The PMOS transistor P50 is turned on by the low-level pull-up control signal WLCB_YF, and the NMOS transistors N50 to N57 are turned off by the low-level pull-down control signal XMAT_YF<0:15>. As a result, the node A is precharged to a high level, thus enabling the redundant cell access signal YRA to a high level. In this manner, in the refresh mode, all the NMOS transistors N50 to N57 are turned off by the pull-down control signal XMAT_YF<0:15> which is kept low in level regardless of the level of the address signal XMAT<0:15>, thereby making it possible to prevent current from being consumed through a current path formed through the NMOS transistors N50 to N57 in the refresh mode.

On the other hand, in a normal mode, the refresh signal REF is disabled to a low level. As shown in FIG. 6, the control signal PCGDLY1 is disabled to a low level in a precharge period and enabled to a high level in an active period. As a result, in the precharge period, the pull-up control signal WLCB_YF becomes low in level, thereby causing the PMOS transistor P50 to be turned on to precharge the node A. In the active period, the pull-up control signal WLCB_YF becomes high in level, thereby causing the PMOS transistor P50 to be turned off to stop the precharging of the node A.

Thereafter, in the case where the fuses F50 to F52 corresponding to address signal bits having a high level among the applied address signal bits XMAT<0:15> are not cut, namely, the corresponding address is not a repair address, the NMOS transistors N50 to N57 are turned on to pull the node A down to a low level. Conversely, in the case where the fuses F50 to F52 corresponding to address signal bits having a high level among the applied address signal bits XMAT<0:15> are cut, namely, the corresponding address is a repair address, the NMOS transistors N50 to N59 are turned off to keep the node A high in level, thus enabling the redundant cell access signal YRA to a high level. As a result, a redundant cell assigned to the corresponding address is accessed.

As apparent from the above description, in the present embodiment, a pull-up control signal WLCB_YF and a pull-down control signal XMAT_YF<0:15> are kept low in level in a refresh mode based on a refresh flag signal REFFLAG which assumes a high level in the refresh mode. Particularly, the pull-down control signal XMAT_YF<0:15>, which is associated with a row path, is prevented from making a low to high level transition in the refresh mode. Therefore, it is possible to reduce current consumption in the refresh mode.

Although the preferred embodiments of the present invention have been disclosed for illustrative purposes, those skilled in the art will appreciate that various modifications, additions and substitutions are possible, without departing from the scope and spirit of this disclosure and the accompanying claims.

The present application is based on and claims priority of Korean patent application number 10-2007-0039251, filed on Apr. 23, 2007, which is incorporated herein by reference in its entirety.

What is claimed is:

1. A column redundancy circuit comprising:
   a first control signal generator configured to receive a refresh flag signal and a control signal and generate a pull-up control signal;
   a second control signal generator configured to receive the refresh flag signal and an address signal, and generate a pull-down control signal; and
   a column repair fuse circuit configured to receive the pull-up control signal and the pull-down control signal, and generate a redundant cell access signal.

2. The column redundancy circuit according to claim 1, wherein the refresh flag signal has an enable width larger than that of a refresh signal.

3. The column redundancy circuit according to claim 1, further comprising:
   a delay for delaying a refresh signal by a predetermined period; and
   a logic device configured to receive the refresh signal and an output signal from the delay, and generate the refresh flag signal.

4. The column redundancy circuit according to claim 3, wherein the logic device performs a NAND operation.

5. The column redundancy circuit according to claim 1, wherein the pull-up control signal is not enabled in response to the refresh signal.

6. The column redundancy circuit according to claim 1, wherein the first control signal generator comprises a logic device for performing a logic operation with respect to the control signal and the refresh flag signal.

7. The column redundancy circuit according to claim 6, wherein the logic device performs a NOR operation.

8. The column redundancy circuit according to claim 6, wherein the first control signal generator further comprises a buffer for buffering an output signal from the logic device.

9. The column redundancy circuit according to claim 1, wherein the pull-down control signal is not enabled in response to the refresh signal.

10. The column redundancy circuit according to claim 1, wherein the second control signal generator comprises a logic device for performing a logic operation with respect to the address signal and the refresh flag signal.

11. The column redundancy circuit according to claim 10, wherein the logic device performs a NOR operation.

12. The column redundancy circuit according to claim 10, wherein the second control signal generator further comprises a buffer for buffering an output signal from the logic device.

13. The column redundancy circuit according to claim 1, wherein the column repair fuse circuit comprises:
   a pull-up device connected between a supply voltage terminal and an output node for pulling the output node up in response to the pull-up control signal;
   a plurality of fuses connected in parallel to the output node;
   a plurality of pull-down devices connected respectively between a ground voltage terminal and the fuses for pulling the output node down in response to the pull-down control signal; and
   a latch for latching a signal at the output node.

* * * * *